United States Patent
Low et al.

(10) Patent No.: US 9,418,929 B1
(45) Date of Patent: Aug. 16, 2016

(54) INTEGRATED CIRCUIT WITH SEWN INTERCONNECTS

(71) Applicants: Boon Yew Low, Petaling Jaya (MY); Weng Hoong Chan, Petaling Jaya (MY)

(72) Inventors: Boon Yew Low, Petaling Jaya (MY); Weng Hoong Chan, Petaling Jaya (MY)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/692,747

(22) Filed: Apr. 22, 2015

(51) Int. Cl.
| | |
|---|---|
| *H01L 23/055* | (2006.01) |
| *H01L 23/48* | (2006.01) |
| *H01L 23/498* | (2006.01) |
| *H01L 23/00* | (2006.01) |
| *H01L 23/532* | (2006.01) |
| *H01L 23/31* | (2006.01) |
| *H01L 25/065* | (2006.01) |
| *H01L 21/768* | (2006.01) |

(52) U.S. Cl.
CPC .... *H01L 23/49838* (2013.01); *H01L 21/76838* (2013.01); *H01L 23/3107* (2013.01); *H01L 23/53276* (2013.01); *H01L 24/17* (2013.01); *H01L 24/81* (2013.01); *H01L 25/0655* (2013.01); *H01L 2221/1094* (2013.01); *H01L 2224/16227* (2013.01); *H01L 2924/14* (2013.01); *H01L 2924/1511* (2013.01)

(58) Field of Classification Search
CPC ............. H01L 2224/92247; H01L 2224/8319; H01L 21/563; H01L 2021/60022; H01L 23/53276; H01L 24/17; H01L 24/81; H01L 2224/16227; H01L 2224/16238; H01L 2924/1511; H01L 2924/14; H01L 2224/48; H01L 2924/00014

See application file for complete search history.

(56) References Cited

U.S. PATENT DOCUMENTS

| | | | | |
|---|---|---|---|---|
| 6,362,525 | B1 * | 3/2002 | Rahim | H01L 23/49838 257/528 |
| 6,784,779 | B2 * | 8/2004 | Shin | B82Y 30/00 257/531 |
| 7,095,112 | B2 * | 8/2006 | Endo | H01L 23/50 257/724 |
| 2006/0262029 | A1 * | 11/2006 | Anderson | H01Q 1/38 343/895 |
| 2012/0036621 | A1 | 2/2012 | Kow | |
| 2012/0080528 | A1 | 4/2012 | Crowley | |
| 2012/0199056 | A1 | 8/2012 | Bayram | |

* cited by examiner

*Primary Examiner* — Jasmine Clark
(74) *Attorney, Agent, or Firm* — Charles E. Bergere

(57) ABSTRACT

A packaged integrated circuit (IC) device includes a flexible substrate having contact pads, an IC die mounted on the substrate and electrically connected to the contact pads, and conductive threads sewn into the substrate. The conductive threads have proximal ends electrically connected to corresponding ones of the contact pads with conductive bumps. The conductive threads eliminate the need for a complicated multi-layer substrate structure for interconnect fan-out so the substrate may be formed of a variety of materials such as cloth or paper.

18 Claims, 7 Drawing Sheets

US 9,418,929 B1

INTEGRATED CIRCUIT WITH SEWN INTERCONNECTS

BACKGROUND OF THE INVENTION

The present invention relates to integrated circuit (IC) device assembly and, more particularly, to the use of conductive threads for interconnections within a packaged IC device.

Typical integrated circuit devices, where devices refers to packaged IC devices ready for attachment to a printed circuit board (PCB) or similar item, comprise integrated circuit dies encapsulated in plastic together with at least a portion of a corresponding and electrically connected lead frame or substrate. These typical devices are well suited for conventional applications, such as mounting on conventional PCBs.

Subsequent developments in assembly technologies have enabled the manufacture of relatively thin and flexible IC devices. Conventional flexible IC devices are assembled using a complicated process involving the attachment of a thin IC die to a thin polyimide substrate and the formation of additional layers, copper vias, plated through-holes, and/or copper traces in multiple lithographic steps. The complexity of conventional assembly processes makes the assembly of conventional flexible IC devices relatively expensive. Accordingly, it would be advantageous to have a simpler and less expensive method of assembling flexible IC devices.

BRIEF DESCRIPTION OF THE DRAWINGS

Other aspects, features, and advantages of the invention will become more fully apparent from the following detailed description, the appended claims, and the accompanying drawings in which like reference numerals identify similar or identical elements. Note that elements in the figures are not drawn to scale.

DETAILED DESCRIPTION

Figure 1:
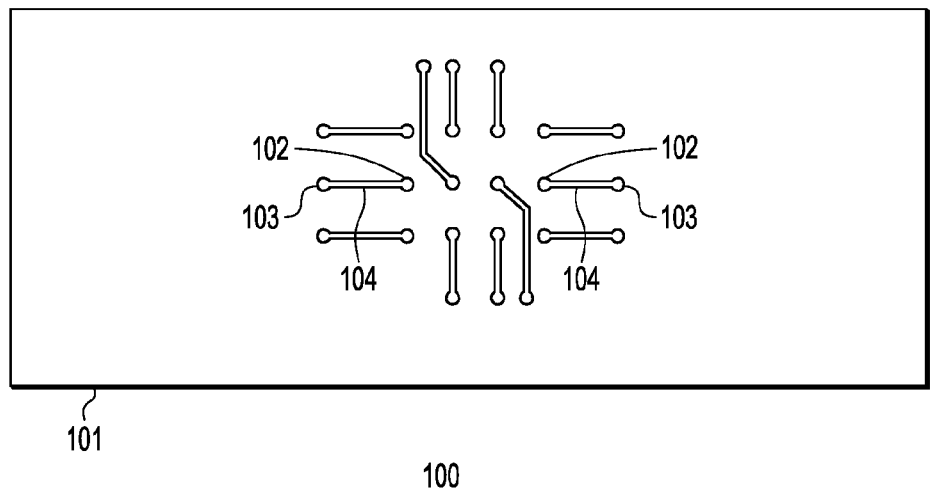
FIG. 1 is a simplified top view of an exemplary substrate in accordance with one embodiment of the invention.

Detailed illustrative embodiments of the present invention are disclosed herein. However, specific structural and functional details disclosed herein are merely representative for purposes of describing example embodiments of the present invention. Embodiments of the present invention may be embodied in many alternative forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "has," "having," "includes," and/or "including" specify the presence of stated features, steps, or components, and do not preclude the presence or addition of one or more other features, steps, or components. It also should be noted that, in some alternative implementations, the functions/acts noted may occur out of the order shown in the figures.

Novel methods of assembling novel packaged IC devices may allow for the manufacture of IC devices at a lower cost relative to conventional packaged IC devices having similar functionality. Note that, as used herein, a packaged IC device refers to a device containing one or more IC dies and one or more interconnections, which device is singulated (if assembled as one of an array or strip) and ready for connection to one or more other devices. The packaged device may be encapsulated or may be without any encapsulant if an encapsulant is not necessary to protect any sensitive components or connections.

In one embodiment of the present invention, carbon nanotube (CNT) thread is used to electrically connect components of a flexible IC device. The CNT thread is sewn into a substrate of the flexible IC device much as a conventional fiber thread would be sewn into a fabric using a sewing machine.

Carbon nanotubes are cylindrical nano-scale structures composed of carbon atoms. One typical form of CNT is a tube whose wall is a one-atom thick sheet of carbon in a regular repeating pattern. The particular properties of a particular CNT structure depend on the form of the structure—such as, for example, its diameter and the interconnection pattern of the constituent carbon atoms. A typical CNT tube has a diameter of less than 10 µm. CNTs may be manufactured to have an electrical and thermal conductivity on par with—or better than—comparably sized metal structures. CNTs may be formed into a flexible CNT thread that may be worked in ways similar to conventional fabric threads. As noted above, in one embodiment, CNT thread is sewn into the substrate of a flexible IC device. Flexible IC devices are relatively thin and their substrates may be pierced by the needle of a sewing machine.

A conventional sewing machine reciprocates a thread-carrying needle in such a way as to sew the thread—which is carried by an eye near the tip of the needle—into a substrate—typically a fabric—by the creation of stitching using the thread. One conventional single-thread stitch is a chain stitch in which the thread is sewn to form a repeating series of interconnected loops. The chain stitch may be relatively easily unraveled from the substrate.

A second, more common, machine stitch is a lock stitch, which uses two threads that may be referred to as (i) a needle thread and a bobbin thread or (ii) a top thread and a bottom thread. The needle thread is carried near the tip of the needle, which pierces the substrate (e.g., fabric) from above and forms a loop below the substrate, with which the bobbin thread is crossed before the needle thread is pulled up, thereby locking the needle and bobbin threads together. If the thread tensions are correctly set, then the two threads are interlocked inside of the substrate and, assuming an opaque substrate, (i) only the needle thread is visible from above the substrate and (ii) only the bobbin thread is visible from below the substrate. If the tensions of the threads are not correctly set, then both threads would be visible from either the top or bottom of the substrate, depending on which of the two threads has the higher tension.

Figure 3:
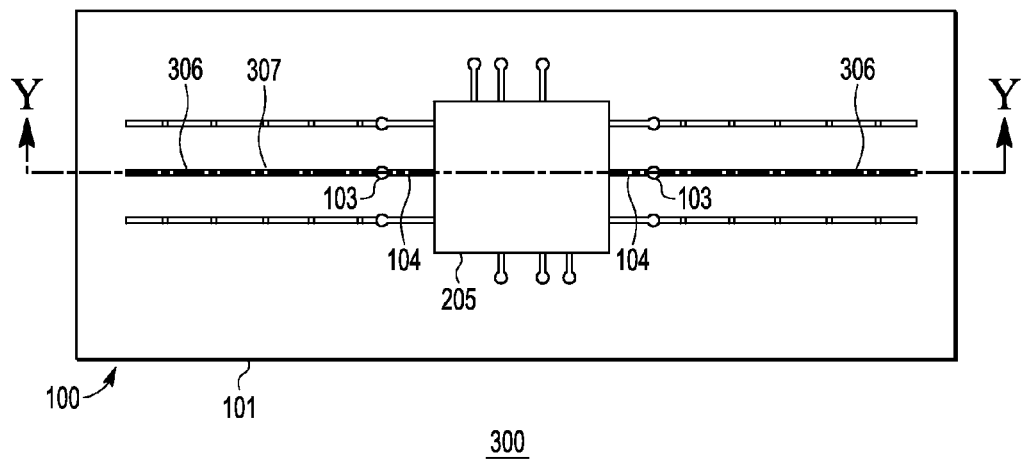
FIG. 3 is a simplified top view of the assembly of FIG. 2 with thread interconnects.
Figure 4:
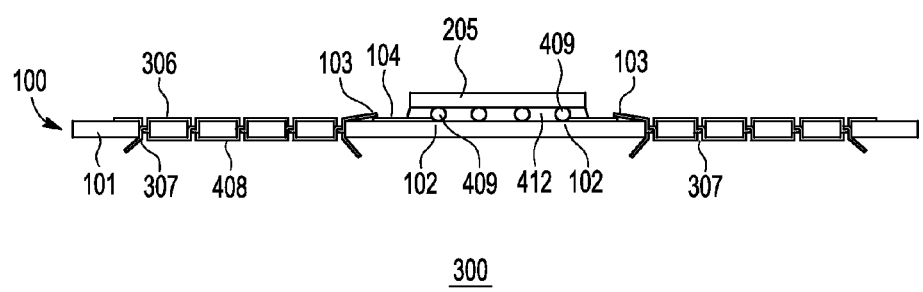
FIG. 4 is a simplified cross-sectional side view of the assembly of FIG. 3.
Figure 5:
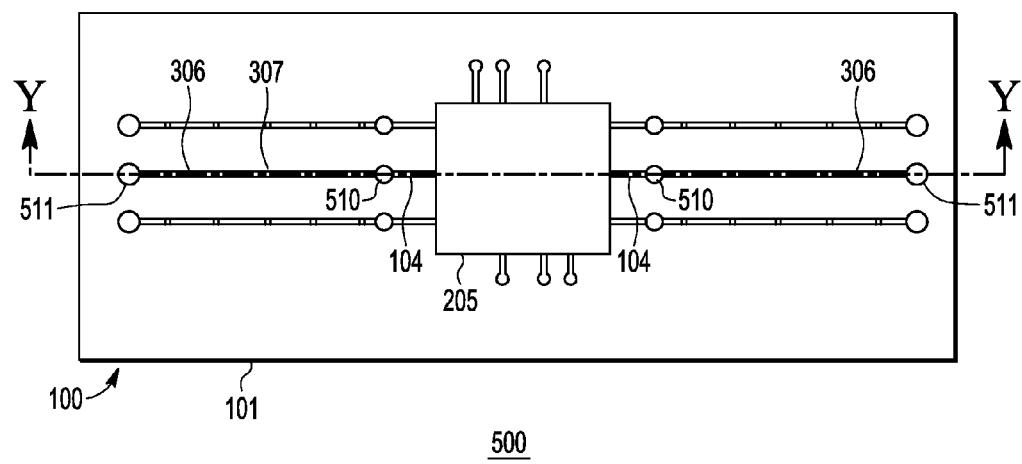
FIG. 5 is a simplified top view of the assembly of FIGS. 3 and 4 with intermediate and distal conductive bumps.
Figure 6:
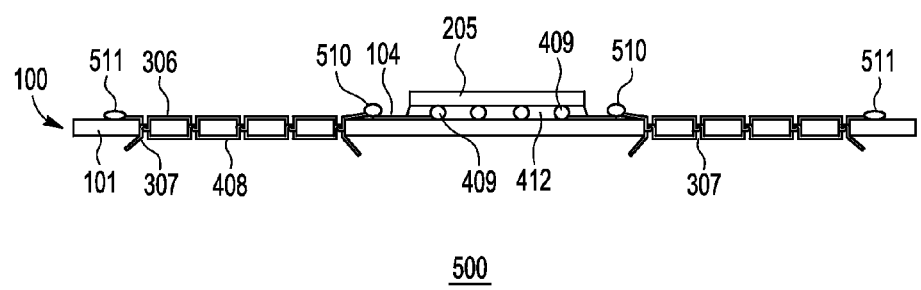
FIG. 6 is a simplified cross-sectional side view of the assembly of FIG. 5.

FIGS. 1-6 illustrate steps in the assembly of an exemplary IC device 500, shown in FIGS. 5 and 6. It should be noted that not every instance of plural elements, such as, for example, contact pads, piercings, and threads, is labeled in the figures; rather, exemplary instances are labeled.

Referring now to FIG. 1, a simplified top view of an exemplary substrate 100 in accordance with one embodiment of the invention is shown. The substrate 100 comprises a substrate medium 101, which may include, for example, ultra thin FR4. FR4 is a material typically used for PCBs and comprises a woven fiberglass cloth with an epoxy resin binder and a flame retardant (the "FR" of FR4 is derived from the initials for "flame retardant"). Typically, FR4 is manufactured at a thickness making the resultant PCB substantially rigid. However, ultra-thin FR4 is both thin and relatively flexible. It should be noted that the substrate medium 101 may further include additional materials (not shown), such as, for example, paper, fabric, solder mask or solder resist material, and polyimide tape.

The substrate 100 further comprises a three-by-four array of twelve under-die contact pads 102 for attachment and electrical connection to an IC die (not shown in FIG. 1). The under-die contact pads 102 connect to twelve corresponding intermediate contact pads 103 by way of corresponding conductive traces 104. The intermediate contact pads 103 may be referred to as dog-ear pads or round connective pads. The under-die contact pads 102, intermediate contact pads 103, and traces 104 may all be formed from a conductive material such as copper. The under-die contact pads 102, intermediate contact pads 103, and traces 104 may be plated on top of the substrate medium 101 or may be formed within or on the substrate medium 101 using, for example, lithography.

Figure 2:
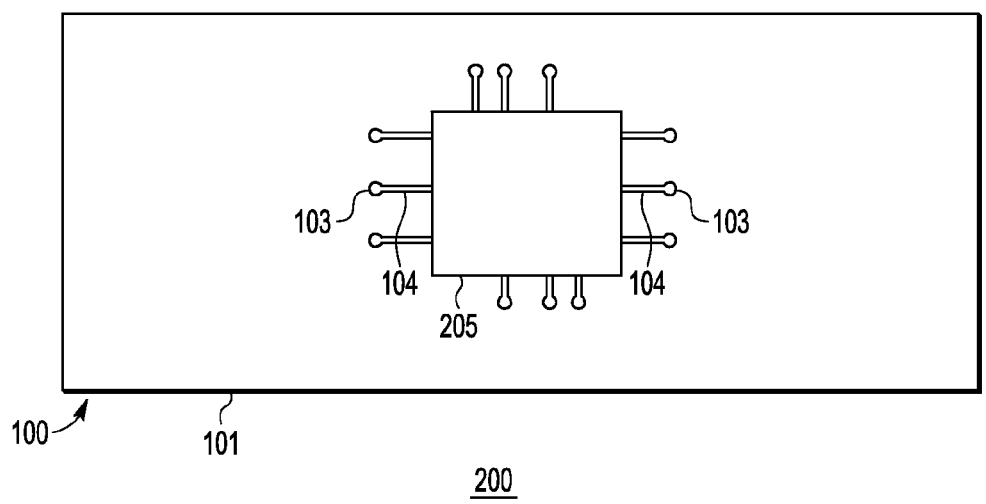
FIG. 2 is a simplified top view of the substrate of FIG. 1 with an IC die mounted thereon.

FIG. 2 is a simplified top view of an assembly 200 formed by the mounting of an exemplary IC die 205 on the substrate 100 of FIG. 1. In a presently preferred embodiment, the IC die 205 comprises a flip-chip die having contact pads (not shown) on its bottom surface that correspond to the under-die contact pads 102 of FIG. 1. The die contact pads may be electrically connected to the corresponding under-die contact pads 102 with conductive balls (not shown in FIG. 2). An underfill (not shown in FIG. 2) may be used to improve the physical adhesion of the IC die 205 to the substrate 100. While the under-die contact pads are covered by the IC die 205, the intermediate contact pads 103 are not covered by the IC die 205.

FIG. 3 is a simplified top view of an assembly 300 formed by attaching electrically conductive threads 306 to the substrate 100. The threads 306 have proximal ends electrically connected to the intermediate contact pads 103 and distal ends spaced from the intermediate contact pads 103 and away from the IC die 205. In one embodiment, the threads 306 comprise sewing needle threads, where there are corresponding bobbin threads (not shown in FIG. 3) also sewn into the substrate 100 of the assembly 200 of FIG. 2 to provide extended and/or varied connection contacts and pathways to the under-die contact pads 102. The needle threads 306 may be Carbon Nanotube (CNT) threads as described above. The bobbin threads, which may be considered dummy threads as it is preferred that they are formed of a non-conductive material, may be, for example, conventional fabric, carbon fiber, or glass fiber threads. The needle threads 306 are sewn so as to contact corresponding intermediate contact pads 103. The needle (not shown) used to sew the needle threads 306 into the substrate 100 punches through the substrate 100 at piercings 307. Note that, while FIG. 3 shows six needle threads 306 sewn to six corresponding intermediate contact pads 103, the other six intermediate contact pads 103 may also have corresponding needle threads 306 sewn to them.

FIG. 4 is a simplified cross-sectional side view of the assemblage 3y of FIG. 3 along cut line Y-Y. FIG. 4 shows the bobbin thread 408 interlocking with the needle thread 306 in the piercings 307. FIG. 4 further shows (i) conductive balls 409 used to connect the bonding pads of the IC die 205 to the corresponding under-die contact pads 102 of the substrate 100 and (ii) underfill 412 that adheres the IC die 205 to the substrate 100. Note that, while FIG. 4 shows the proximal ends of the needle threads 306 trimmed to reach just to the corresponding intermediate contact pad 103, the proximal end of the needle thread 306 may extend beyond the corresponding intermediate contact pad 103. Furthermore, in some implementations, the needle may pierce through the corresponding intermediate contact pad 103 so that the intermediate contact pad 103 corresponds with one of the piercings 307.

FIG. 5 is a simplified top view of an assembly 500 formed by adding intermediate and distal conductive bumps 510 and 511 to the assemblage 300 of FIGS. 3 and 4. In particular, the intermediate conductive bumps 510 electrically connect the proximal ends of the needle threads 306 to the intermediate contact pads 103. In addition, the distal ends of the needle threads 306 are secured to the substrate 100 with the distal conductive bumps 511. The conductive bumps 510 and 511 may comprise, for example, solder and may be formed by, for example, soldering or stud-bump forming.

FIG. 6 is a simplified cross-sectional side view of the assembly 500 of FIG. 5 along cut line Y-Y. Note that the distal conductive bumps 511 may be flatter and larger than the intermediate conductive bumps 510 in order to allow for easier connections to external components. External components may include, for example, power supplies, batteries, light-emitting diodes (LEDs), sensors, connectors, and/or other IC devices.

Figure 7:
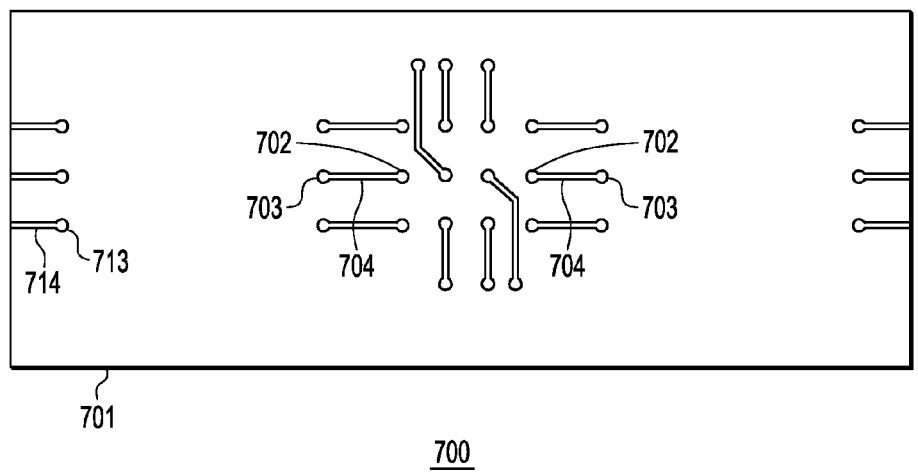
FIG. 7 is a simplified top view of an exemplary substrate in accordance with an alternative embodiment of the invention.

FIG. 7 is a simplified top view of an exemplary substrate 700 in accordance with an alternative embodiment of the invention. Elements of the substrate 700 that are substantially similar to corresponding elements of the substrate 100 of FIG. 1 are similarly labeled, but with a different prefix. Notably, the substrate 700 comprises a substrate medium 701, under-die contact pads 702, corresponding intermediate contact pads 703, and corresponding conductive traces 704.

In addition, the substrate 700 comprises distal contact pads 713 and corresponding electrically conductive distal traces 714 that are connected to the distal contact pads 713. The distal contact pads 713 are for connecting to the distal ends of the needle threads (not shown in FIG. 7). The distal traces 714 are for easier connection to external devices. The distal traces 714 are shown as linear traces, but they may be in any suitable shape or pattern to complement a corresponding attachment mechanism on an external device. The distal traces 714 may, for example, include leads extending out past the edges of the substrate medium 701. The distal traces 714 may, for example, include holes or other receptacles for connecting to external devices.

Figure 8:
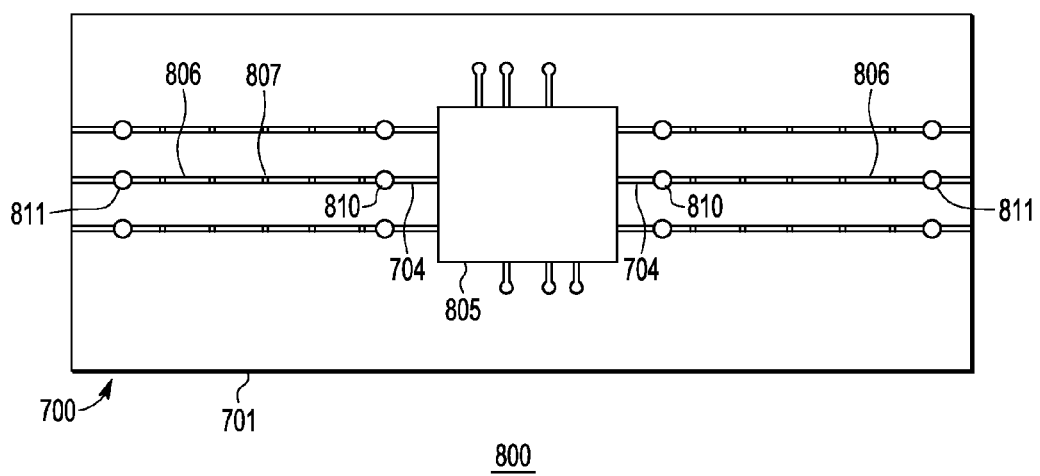
FIG. 8 is a simplified top view of the substrate of FIG. 7 after the attachment of an IC die, thread connections, and the attachment of (1) intermediate conductive bumps and (2) distal conductive bumps.

FIG. 8 is a simplified top view of an assembly 800 that comprises the substrate 700 after the attachment of an IC die 805, the sewing of needle threads 806 into the substrate 700, and the attachment of (1) intermediate conductive bumps 810 and (2) distal conductive bumps 811. Elements of the assembly 800 that are substantially similar to corresponding elements of the assembly 500 (FIG. 5) are similarly labeled, but with a different prefix. Note that, during sewing, the needle (not shown) may pierce through the distal contact pads 713 so that the distal contact pads 713 correspond to piercings (not shown) where the needle threads 806 interlock with the bobbin threads (not shown).

Figure 9:
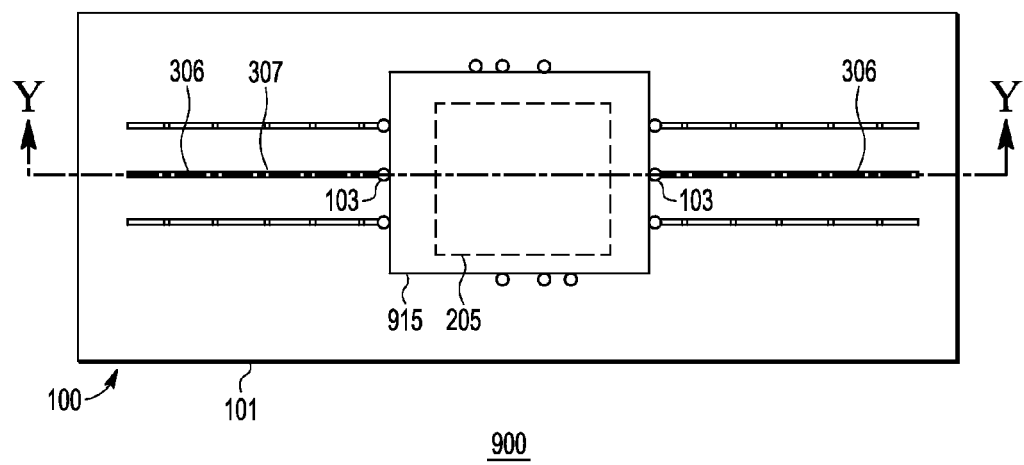
FIG. 9 is a simplified top view of an exemplary assembly in accordance with an alternative embodiment of the invention where the IC die of the assembly of FIG. 2 is covered with an encapsulant prior to making thread connections.
Figure 10:
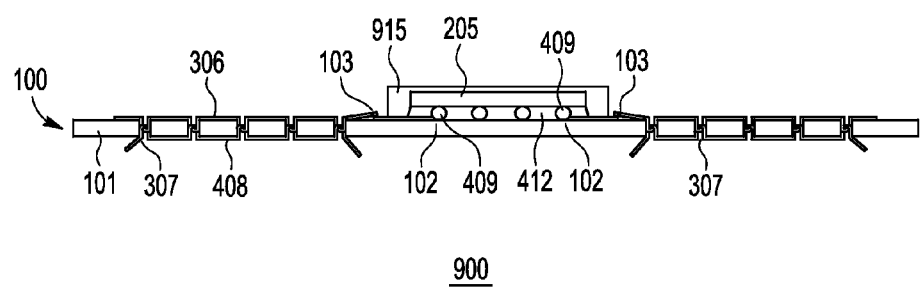
FIG. 10 is a side cross-sectional view of the assembly of FIG. 9.

FIG. 9 is a simplified top view of an exemplary assembly 900 in accordance with another alternative embodiment of the invention where the IC die 205 of the assembly 200 of FIG. 2 is covered with an encapsulant 915 prior to sewing connections with the needle thread 306. Note that FIG. 1 is also illustrative of this alternative embodiment. FIG. 10 is a side cross-sectional view of the assembly 900 of FIG. 9.

The encapsulant 915 may be an epoxy molding compound as is known in the art. The underfill 412 may be a mold underfill, where the underfill 412 and the encapsulant 915 comprise the same material.

Figure 11:
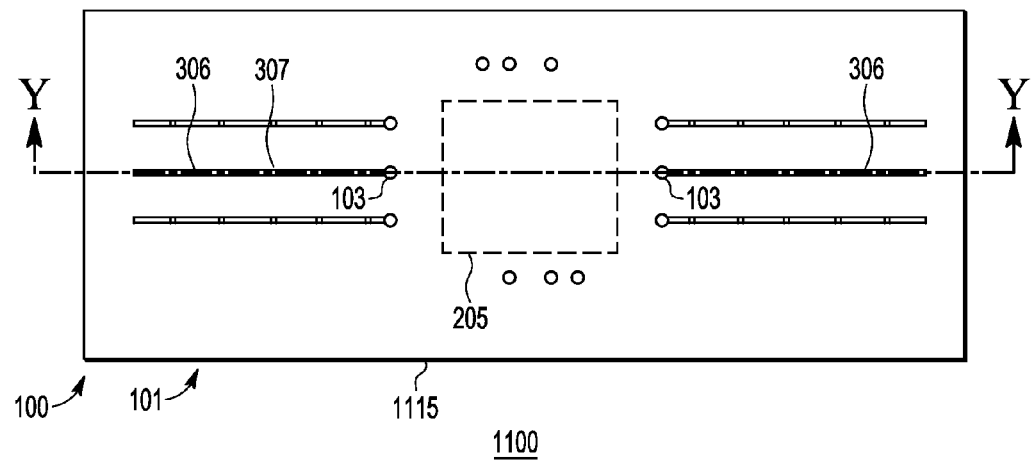
FIG. 11 is a simplified top view of an exemplary assembly in accordance with an alternate embodiment of the invention where the entire top side of the assembly of FIG. 2 is covered with an encapsulant prior to adding the thread connections.
Figure 12:
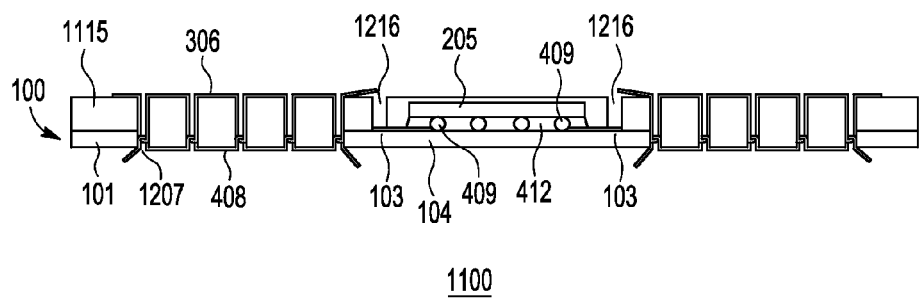
FIG. 12 is a side cross-sectional view of the assembly of FIG. 11.

FIG. 11 is a simplified top view of an exemplary assembly 1100 in accordance with an alternative embodiment of the invention where the entire top side of the assembly 200 of FIG. 2 is covered with an encapsulant 1115 prior to sewing connections with the needle thread 306. Note that FIG. 1 is also illustrative of this alternative embodiment. FIG. 12 is a side cross-sectional view of the assembly 1100 of FIG. 11.

The encapsulant 1115 may be an epoxy molding compound. The encapsulant 1115 has several holes 1216 to allow access to the intermediate contact pads 103. The holes 1216 may be filled with a conductor to serve as conductive vias to the surface of the substrate 100. Alternatively, metal pillars may be formed in the locations of the holes 1216 prior to encapsulation with the encapsulant 1115. If the encapsulant 1115 is too hard for a sewing needle to pierce through, then piercings 1207 may be pre-formed prior to sewing by, for example, mechanical or laser drilling. After sewing with the needle threads 306, the proximal ends of the needle threads 306 may be inserted into the holes 1216 and then soldered to the corresponding intermediate contact pads 103 for a more secure connection. The underfill 412 may be a mold underfill, where the underfill 412 and the encapsulant 1115 comprise the same material.

Figure 13:
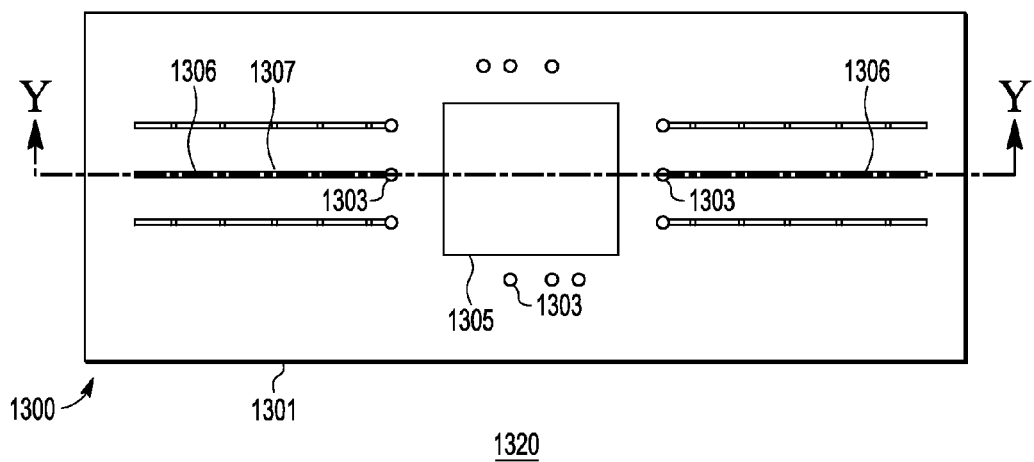
FIG. 13 is a simplified top view of an exemplary assembly in accordance with an alternate embodiment of the invention where the substrate includes traces and vias.
Figure 14:
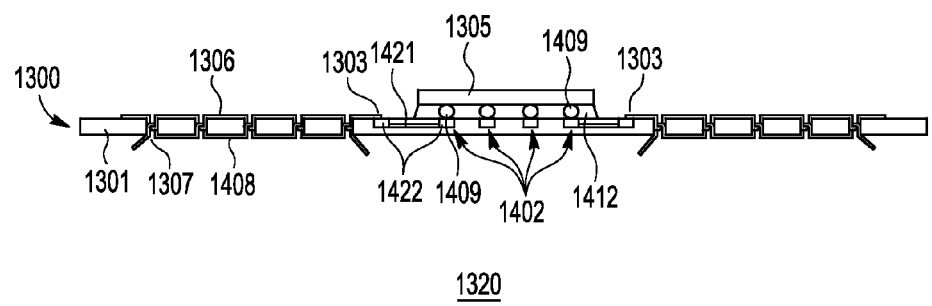
FIG. 14 is a side cross-sectional view of the assembly of FIG. 13.

FIG. 13 is a simplified top view of an exemplary assembly 1320 in accordance with an alternative embodiment of the invention where the traces of the substrate 1300 are buried inside the substrate 1300 and connect to the surface using conductive vias. FIG. 14 is a side cross-sectional view of the assembly 1320 along cut line Y-Y. Elements of the assembly 1320 that are substantially similar to corresponding elements of the assembly 500 of FIGS. 5 and 6 are similarly labeled, but with a different prefix.

Notably, the assembly 1320 comprises a substrate 1300, a sewn needle thread 1306, a sewn bobbin thread 1408, a mounted IC die 1305, and underfill 1412 and conductive balls 1409 that attach and electrically connect the IC die 1305 to the substrate 1300. The substrate 1300 comprises a substrate medium 1301, several buried traces 1421, corresponding intermediate contact pads 1303, corresponding under-die contact pads 1402, and corresponding vias 1422 that connect the contact pads 1303 and 1402 to the corresponding buried traces 1421. The needle threads 1306 and the bobbin threads 1408 interlock inside the piercings 1307 formed by the needle (not shown) in the substrate 1300 during sewing.

Several illustrative embodiments of the invention have been described as having various feature combinations. It should be noted that, unless otherwise indicated, features of different inventions may be recombined in ways not described above, unless doing so would render the combination inoperable.

It should be noted that the sewing may also be used to attach additional elements to the substrate including, for example, another substrate layer.

Embodiments of the invention have been described where the sewing of the needle and bobbin threads into the substrate is performed after the mounting of the IC die onto the substrate. The invention is not, however, so limited. In alternative embodiments, the needle threads may be sewn into the substrate prior to the mounting of the IC die.

Embodiments of the invention have been described where the bobbin threads are used on the underside of the substrate. It should be noted that the loose ends of a bobbin thread may, for example, (i) be left loose, (ii) be trimmed, (iii) be solder bumped to the substrate, or (iv) be otherwise attached to the substrate.

Embodiments of the invention have been described where the substrate medium may be ultra-thin FR4. The invention is not, however, so limited. Any suitable substrate medium that is sufficiently non-conductive may be used. The substrate may also be relatively rigid. A particularly rigid substrate may have piercings pre-formed prior to sewing, as described elsewhere herein. Suitable substrate mediums include, for example, polyimide tape, paper, glass, leather, polyvinyl chloride (PVC), polyethylene terephthalate (PET), sheets, fabric, and cloth. Sheet, fabric, and cloth materials may include, for example, cotton, linen, silk, wool, nylon, bamboo, barkcloth, polyester, polypropylene, polyolefin, and cross-linked polyolefin ("polycryo").

Embodiments of the invention have been described where the IC die is a flip chip conductively connected to the substrate with conductive balls. The invention is not, however, so limited. In alternative embodiments, other suitable types of IC dies—such as, for example, through-silicon via (TSV) dies—and/or other types of conductive connections may be used instead.

In some alternative embodiments, the IC die is inside an IC-die carrier such as, for example, a ball-grid array (BGA) package, where the IC die may be wire-bonded to a carrier substrate and encapsulated in an encapsulant. In these embodiments, the carrier substrate has contact pads on its underside that correspond to the under-die contact pads of the IC-device substrate. In these embodiments, the IC-die carrier functions as the above-described IC die. Consequently, the above-described embodiments that use a flip-chip die or TSV die may be considered to have IC-die carriers that include only an IC die.

In some alternative embodiments, the IC die has bond pads on its top surface that are electrically connected—via, for example, wire bonds—to the intermediate contact pads. As a result, the substrate would not need under-die contact pads or connected traces, which may be absent from the substrate. In these alternative embodiments, the IC die and wire bonds are encapsulated in an encapsulant.

Embodiments of the invention have been described wherein the packaged IC device comprises one IC die. It should be noted that a single packaged IC device in accordance with the present invention may comprise a plurality of IC dies.

Embodiments of the invention have been described where the needle thread is sewn with a sewing machine. The invention is not, however, so limited. In some alternative embodiments, the thread may be manually sewn through the substrate, either piercing the substrate or using pre-formed piercings in the substrate.

Embodiments of the invention have been described where the needle thread may be a CNT thread and the bobbin thread may be a conventional non-conductive fabric thread. The invention is not, however, so limited. In alternative embodiments, either or both of the needle threads and the bobbin threads may be CNT thread or other conductive thread, such as, for example, metallic thread. In addition, in some alternative embodiments, the needle thread may be a non-conductive thread with the bobbin thread being a CNT or other conductive thread. Note that, in embodiments where the bobbin thread is conductive, the intermediate and distal conductive bumps may be placed on the underside of the substrate.

Embodiments of the invention have been described where the sewing needle punches holes through the substrate during the stitching process to form the piercings where the needle and bobbin threads interlock. The invention is not, however, so limited. In some alternative embodiments, the piercings are pre-formed by, for example, laser drilling or any other suitable means. In some alternative embodiments an auxiliary thread other then a bobbin thread is sewn together with the needle thread to form suitable stitching.

Embodiments of the invention have been described where a needle thread and a bobbin thread are sewn together to form a lock stitch. The invention is not, however, so limited. In some alternative embodiments, the needle and bobbin threads are sewn together to form a different suitable kind of stitch. In some other alternative embodiments, only a needle thread is used and no bobbin thread is used. One such alternative embodiment may use the chain stitch.

Embodiments of the invention have been described where the needle thread is sewn as a straight-line conductive path from an intermediate contact pad to a distal location. The invention is not, however, so limited. In alternative embodiments the needle thread is sewn in a conductive path that is not a straight line, where the conductive path may comprise a plurality of connected straight-line segments, curves, loops, decorative segments, and/or backstitches.

It will be further understood that various changes in the details, materials, and arrangements of the parts which have been described and illustrated in order to explain the nature of this invention may be made by those skilled in the art without departing from the scope of the invention as expressed in the following claims.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

Unless explicitly stated otherwise, each numerical value and range should be interpreted as being approximate as if the word "about" or "approximately" preceded the value of the value or range. As used in this application, unless otherwise explicitly indicated, the term "connected" is intended to cover both direct and indirect connections between elements.

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

In this specification including any claims, the term "each" may be used to refer to one or more specified characteristics of a plurality of previously recited elements or steps. When used with the open-ended term "comprising," the recitation of the term "each" does not exclude additional, unrecited elements or steps. Thus, it will be understood that an apparatus may have additional, unrecited elements and a method may have additional, unrecited steps, where the additional, unrecited elements or steps do not have the one or more specified characteristics.

Although the steps in the following method claims are recited in a particular sequence with corresponding labeling, unless the claim recitations otherwise imply a particular sequence for implementing some or all of those steps, those steps are not necessarily intended to be limited to being implemented in that particular sequence.

The invention claimed is:

1. A packaged integrated circuit (IC) device, comprising:
a substrate having a first plurality of contact pads;
an IC die mounted on the substrate and electrically connected to the first plurality of contact pads;
a first conductive thread sewn into the substrate, wherein:
the first conductive thread has a proximal end and a distal end;
the proximal end is electrically connected to a corresponding one of the contact pads by a corresponding conductive bump; and
the proximal end pierces the corresponding contact pad of the first plurality of contact pads.

2. The device of claim 1, wherein:
the substrate further comprises:
a plurality of under-die contact pads;
a plurality of conductive balls; and
a plurality of conductive traces;
the IC die has a plurality of IC-die contact pads; and
each of the under-die contact pads is:
electrically connected to at least one of the contact pads by way of at least one of the conductive traces; and
electrically connected to a corresponding one of the IC-die contact pads by way of a corresponding one of the conductive balls.

3. The device of claim 1, wherein the first conductive thread is a carbon nanotube (CNT) thread.

4. The device of claim 1, further comprising a second thread, wherein:
the first conductive thread and the second thread are sewn together to form a lock stitch;
the first conductive thread is one of a needle thread and a bobbin thread; and
the second thread is the other of the needle thread and the bobbin thread.

5. The device of claim 4, wherein the second thread is a non-conductive thread.

6. The device of claim 1, further comprising a distal conductive bump electrically connected to the distal end of the first conductive thread and securing the distal end of the first conductive thread to the substrate, wherein the distal conductive bump is adapted for electrical connection to a component external to the IC device.

7. The device of claim 1, wherein:
each contact pad of the first plurality of contact pads has a corresponding conductive thread sewn into the substrate; and
each corresponding conductive thread has (i) a distal end and (ii) a proximal end that is electrically connected to the corresponding contact pad by a corresponding conductive bump.

8. The device of claim 1, further comprising a plurality of distal contact pads and corresponding electrically connected distal traces, wherein:
the distal end of the first conductive thread is electrically connected to a corresponding one of the distal contact pads.

9. The device of claim 8, wherein the distal end of the first conductive thread pierces through the corresponding distal contact pad.

10. The device of claim 1, further comprising an encapsulant that covers the IC die and at least part of the substrate.

11. The device of claim 10, wherein:
the first conductive thread is also sewn into the encapsulant;
the encapsulant includes recesses corresponding to the first plurality of contact pads;
the proximal end of the first conductive thread is located within a corresponding one of the recesses; and
the corresponding one of recesses comprises solder that electrically connects the proximal end of the first conductive thread to the corresponding contact pad.

12. The device of claim 10, wherein:
the first conductive thread is also sewn into the encapsulant;
the encapsulant includes metallic pillars corresponding to the first plurality of contact pads; and
the proximal end of the first conductive thread is electrically connected to the corresponding contact pad by way of the corresponding metallic pillar.

13. The device of claim 11, wherein the first conductive thread is sewn into the substrate but not the encapsulant.

14. The device of claim 1, further comprising:
one or more additional IC dies;
corresponding pluralities of additional IC die contact pads;
corresponding conductive threads having proximal and distal ends; and
corresponding conductive bumps connecting the proximal ends of the corresponding conductive threads to corresponding ones of the additional IC contact pads.

15. The device of claim 1, wherein the IC die is part of an IC die carrier mounted on the substrate, wherein the IC die carrier comprises:
the IC die;
a carrier substrate upon which the IC die is mounted; and
an encapsulant that covers the IC die and at least a portion of the carrier substrate.

16. A packaged integrated circuit (IC) device, comprising:
a substrate having a plurality of under-die contact pads, a plurality of contact pads, and a plurality of conductive traces electrically connecting the under-die contact pads with respective ones of the contact pads;
an IC die mounted on the substrate and electrically connected to the under-die contact pads;
a first conductive thread sewn into the substrate, wherein the first conductive thread has a proximal end electrically connected to a corresponding one of the contact pads with a corresponding conductive bump;
a second, non-conductive, thread sewn together with the first conductive thread using a lock stitch, wherein the first conductive thread is one of a needle thread and a bobbin thread, and the second thread is the other of the needle thread and the bobbin thread; and
an encapsulant that covers the IC die and the corresponding conductive bump that connects the first conductive thread to the one of the contact pads.

17. A method for packaging an integrated circuit (IC) device, the method comprising:
providing a substrate having a plurality of contact pads;
mounting an IC die on the substrate;
electrically connecting the IC die to the plurality of contact pads;
sewing a first conductive thread into the substrate, wherein the first conductive thread has a proximal end and a distal end;
electrically connecting the proximal end of the first conductive thread to a corresponding one of the contact pads with a corresponding conductive bump; and
wherein the proximal end of the first conductive thread pierces the corresponding one of the contact pads.

18. The packaged IC device of claim 17.

* * * * *